United States Patent
Bains et al.

(10) Patent No.: US 9,030,903 B2
(45) Date of Patent: May 12, 2015

(54) METHOD, APPARATUS AND SYSTEM FOR PROVIDING A MEMORY REFRESH

(71) Applicants: Kuljit S. Bains, Olympia, WA (US); John B. Halbert, Beaverton, OR (US); Suneeta Sah, Portland, OR (US); Zvika Greenfield, Kfar Sava (IL)

(72) Inventors: Kuljit S. Bains, Olympia, WA (US); John B. Halbert, Beaverton, OR (US); Suneeta Sah, Portland, OR (US); Zvika Greenfield, Kfar Sava (IL)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 13/625,741

(22) Filed: Sep. 24, 2012

(65) Prior Publication Data

US 2014/0089576 A1 Mar. 27, 2014

(51) Int. Cl.
*G11C 11/406* (2006.01)
*G11C 16/00* (2006.01)
*G06F 13/16* (2006.01)

(52) U.S. Cl.
CPC ............ *G11C 16/00* (2013.01); *G06F 13/1636* (2013.01); *G11C 11/40611* (2013.01); *G11C 11/40618* (2013.01); *G11C 11/40622* (2013.01)

(58) Field of Classification Search
CPC ...................................................... G11C 11/406
USPC ........................................................ 365/222
See application file for complete search history.

(56) References Cited

U.S. PATENT DOCUMENTS

| | | | |
|---|---|---|---|
| 7,133,960 B1* | 11/2006 | Thompson et al. ................ 711/5 |
| 2003/0167428 A1* | 9/2003 | Gold ............................... 714/720 |
| 2007/0038906 A1* | 2/2007 | Lakhani et al. ................ 714/710 |
| 2011/0235410 A1* | 9/2011 | Sharon et al. ............. 365/185.02 |
| 2012/0215972 A1* | 8/2012 | Asnaashari et al. ........... 711/103 |
| 2014/0003173 A1* | 1/2014 | Ku ................................... 365/200 |
| 2014/0006703 A1 | 1/2014 | Bains et al. |
| 2014/0006704 A1 | 1/2014 | Greenfield et al. |

* cited by examiner

*Primary Examiner* — Hoai V Ho
*Assistant Examiner* — Min Huang
(74) *Attorney, Agent, or Firm* — Blakely, Sokoloff, Taylor & Zafman LLP (57) ABSTRACT

A memory controller to implement targeted refreshes of potential victim rows of a row hammer event. In an embodiment, the memory controller receives an indication that a specific row of a memory device is experiencing repeated accesses which threaten the integrity of data in one or more victim rows physically adjacent to the specific row. The memory controller accesses default offset information in the absence of address map information which specifies an offset between physically adjacent rows of the memory device. In another embodiment, the memory controller determines addresses for potential victim rows based on the default offset information. In response to the received indication of the row hammer event, the memory controller sends for each of the determined plurality of addresses a respective command to the memory device, where the commands are for the memory device to perform targeted refreshes of potential victim rows.

26 Claims, 6 Drawing Sheets

METHOD, APPARATUS AND SYSTEM FOR PROVIDING A MEMORY REFRESH

BACKGROUND

1. Technical Field

Embodiments of the invention are generally related to memory management, and more particularly to the control of memory refresh operations.

2. Background Art

With advances in computing technology, computing devices are smaller and have much more processing power. Additionally, they include more and more storage and memory to meet the needs of the programming and computing performed on the devices. The shrinking size of the devices together with the increased storage capacity is achieved by providing higher density devices, where the atomic storage units within a memory device have smaller and smaller geometries.

With the latest generation of increased density, intermittent failure has appeared in some devices. For example, some existing DDR3 based systems experience intermittent failures with heavy workloads. Researchers have traced the failures to repeated access to a single row of memory within the refresh window of the memory cell. For example, for a 32 nm process, if a row is accessed 550K times or more in the 64 millisecond refresh window, the physically adjacent wordline to the accessed row has a very high probability of experiencing data corruption. The row hammering or repeated access to a single row can cause migration across the passgate. The leakage and parasitic currents caused by the repeated access to one row cause data corruption in a non-accessed physically adjacent row. The failure issue has been labeled as a 'row hammer' or '1 row disturb' issue by the DRAM industry where it is most frequently seen.

BRIEF DESCRIPTION OF THE DRAWINGS

The various embodiments of the present invention are illustrated by way of example, and not by way of limitation, in the figures of the accompanying drawings and in which.

DETAILED DESCRIPTION

As described herein, a memory controller sends commands to a memory device for targeted refreshes to address a row hammer condition or row hammer event. When a specific row of a memory device is repeatedly accessed within a certain time window, a physically adjacent row may experience data corruption. The repeated access within the time window is referred to herein as a row hammer event or row hammer condition. The physically adjacent row is a victim row to the row hammer event. As described herein the memory controller receives an indication of a row hammer event, in which a specific row is accessed more than a threshold number of times within the time window. The memory controller identifies the row associated with the row hammer event, and sends one or more commands to the memory device to cause the memory device to perform a targeted refresh to reduce the likelihood of data corruption in a victim row or rows.

The theoretical maximum number of times a row can be accessed within a 64 ms window (e.g., a refresh window) is 1.35 million times (64 ms refresh window divided by 47 ns access time) for current DRAMs (dynamic random access memory). The practical maximum without risking data corruption in the victim rows is much lower, and depends on the process technology used. However, by detecting a row hammer event and sending one or more commands to implement a targeted refresh, the risk of data corruption can be reduced without restricting access to a specific row of memory. The examples provided herein primarily discuss the row hammer issue with respect to DRAM. However, it will be understood that the row hammer issue is more generally a memory device scaling issue, which occurs as memory densities increase. Thus, the descriptions with respect to DRAM will be understood as non-limiting examples that can be applied to other memory technologies that include memory controller or equivalent logic.

In a memory device, rows that are physically adjacent may often be logically labeled differently from one manufacturer to another. Typically a manufacturer maps logically adjacent rows of memory by a physical address offset, and the offsets can be different among different manufacturers. The memory device itself may be configured to determine how to map access requests to the physical memory resources. Memory controllers are generally designed to be compatible with many different types of memory devices, and so they are generally not designed specifically with respect to any particular manufacturer's device. Such memory controllers do not have any need to know the addresses of physically adjacent rows, as writes and subsequent reads to a given logical address are directed to the same physical address by the memory device, Thus, memory controllers do not traditionally have logic or information to indicate what rows are physically adjacent.

More recently, memory controllers begun to incorporate logic be variously configured—e.g. by a firmware interface process such as a BIOS, an Extensible Firmware Interface (EFI) process, a Unified Extensible Firmware Interface (UEFI) process and/or the like—to have access to reference information which describes respective address offsets for one or more memory devices controlled by that memory controller. For example, a dual in-line memory module (DIMM) may directly or indirectly provide to such a memory controller reference information which describes an address offset between physically adjacent rows of a dynamic RAM (DRAM) chip residing on that DIMM. However, for any of a variety of reasons, memory controllers in various applications may not have access to such reference information for at least one (or indeed, any) memory device—e.g. for certain types of memory such as that located directly on a motherboard. Accordingly, such a memory controller may be unable to locate address map information specifying an offset between physically adjacent rows of the memory device which is experiencing a row hammer event.

In one embodiment, a memory controller may issue, for each of multiple potential victim rows for an hammer event, a respective command (or commands) for implementing a corresponding targeted refresh of the potential victim row. For example, the memory controller may send for a potential victim row a sequence of commands including an Activate command and a Precharge command.

Figure 1:
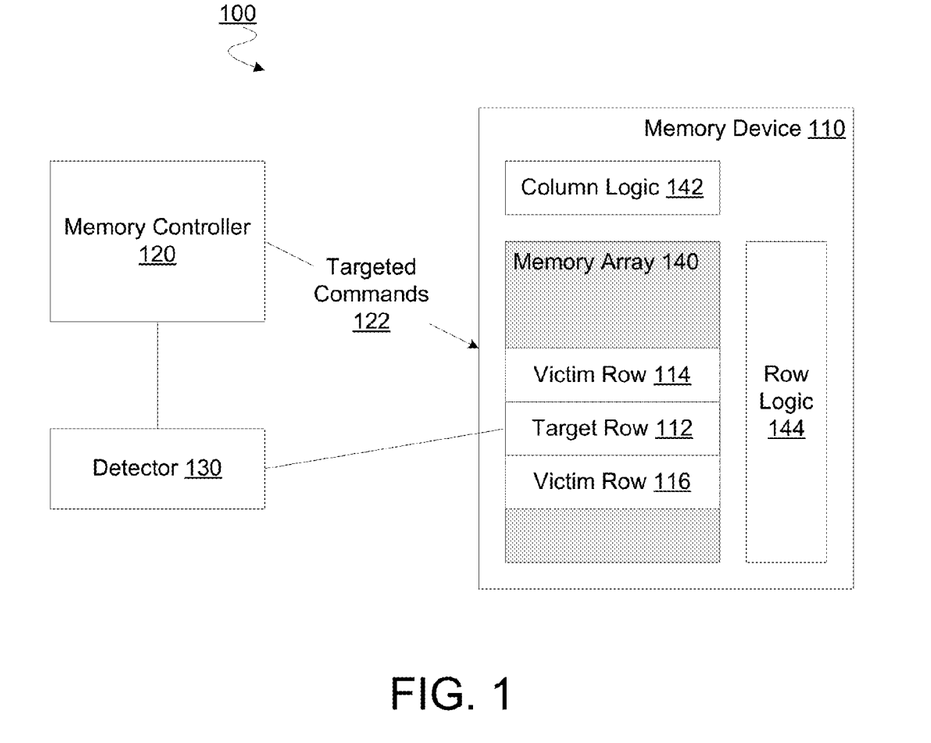
FIG. 1 is a block diagram illustrating element of a system for performing a targeted refresh according to an embodiment.

FIG. 1 is a block diagram of an embodiment of a system 100 that provides commands for implementing targeted refreshes. System 100 may include memory device 110 coupled to memory controller 120. Memory device 110 may include any type of memory technology that has adjacent rows of memory cells, where data is accessible via a wordline or the equivalent. In one embodiment, memory device 110 includes dynamic random access memory (DRAM) technology.

Memory device 110 may include memory array 140, which represents one or more logical and/or physical groups of memory. An example of a grouping of memory is a bank of memory. Memory device 110 may include column logic 142 and row logic 144, which are used to decode an access instruction to the proper memory location within memory array 140. There is no requirement for the number of rows and columns to be equal, and in fact they are typically not equal. Memory controller 120 may send commands or instructions to memory device 110 over a command bus (e.g., a command/address (C/A) bus), which are then interpreted by memory device 110. Memory device 110 may decode the command information to perform a variety of access functions within the memory, and decode address information via column logic 142 and row logic 144. The logic may access a specific location in memory with a combination of a column address strobe or signal (CAS) and a row address strobe or signal (RAS). Rows of memory may be implemented in accordance with known memory architectures or their derivatives. Briefly, a row of memory may include one or more addressable columns of memory cells, as identified by the CAS generated by column logic 142. The rows are addressable via the RAS generated by row logic 144.

Memory array 140 may include one or more rows that are the targets of repeated access within a time window. Such a row is subject to a row hammer condition. In many modern memory devices, the architecture of the semiconductor layout causes one or more physically adjacent rows to be at risk of becoming corrupted. The row or rows at risk of becoming corrupted due to row hammer condition are referred to herein as victim rows. At a given time during operation of system 100, memory array 140 may include target row 112, which is a row of memory subject to hammering, or being accessed repeatedly within a given time period. The target row 112 is the target of the row hammer event. In many modern memory devices, the architecture of the semiconductor layout causes one or more physically adjacent rows to be at risk of becoming corrupted. The rows at risk of becoming corrupted due to row hammer of target row 112 are illustrated as victim row 114 and victim row 116. Either or both of victim rows 114, 116 may be at risk, depending on the physical layout of memory device 110.

It will be understood that different memory device manufacturers use different logic and architectures to utilize the memory resources of the devices. For example, different memory device manufacturers may use different offsets to map between logical memory addresses used in the host processor (not shown) and the physical memory addresses used internally to memory device 110. In one embodiment, memory controller 120 utilizes the same logical memory addresses as used by a host processor (not shown) of system 100. Thus, in one embodiment, memory controller 120 may provide a row address to memory device 110 indicating a particular row. The memory controller 120 may indicate the row address in conjunction with and/or as part of a command that it issues to memory device 110.

However, in certain applications, memory controller 120 may not have access to information describing, for example, the address offset between target row 112 and one or each of the physically adjacent victim rows 114, 116. Moreover, in the absence memory controller 120 specifying an address of victim row 114 or victim row 116, memory device 110 may not include logic to identify that victim row 114 or victim row 116 is to be a target of a targeted refresh to address hammering of target row 112.

In an embodiment, memory controller 120 generates, in response to detecting a row hammer event, targeted commands 122 for causing memory device 110 to variously perform targeted refreshes of respective rows. In one embodiment, targeted commands 122 includes a command or series of commands for refreshing a particular row of memory array 140. For example, in one embodiment, such a sequence may include an Activate command specifying activation of a potential victim row, followed by a Precharge command for that same potential victim row. Any of a variety of additional or alternative commands which explicitly specify such a potential victim row may be included in target commands 122, according to different embodiments.

Detector 130 represents hardware and/or software or other logic that enables system 100 to detect a row hammer event. The mechanism or mechanisms used to detect the row hammer condition may not be limiting on certain embodiments. In an embodiment, detector 130 determines when target row 112 experiences repeated accesses within a threshold. Detector 130 may include hardware and/or logic at memory device 110, memory controller 120, and/or separate from either memory device 110 or memory controller 110.

The mechanisms of detector 130 may include, for example, some way of determining a number of times a row is accessed, as well as determining the period of time in which the accesses occur. The row hammer event is not simply about how many times a row is accessed, but how many times in a given time period. Once a row is refreshed, the conditions that could cause data corruption are overcome. Thus, the time period for the monitoring should, in an embodiment, be based at least in part on the refresh rate. Targeted commands 122 may overcome the conditions that cause data corruption in between normally scheduled refresh event that may occur periodically on the refresh cycle.

Figure 2:
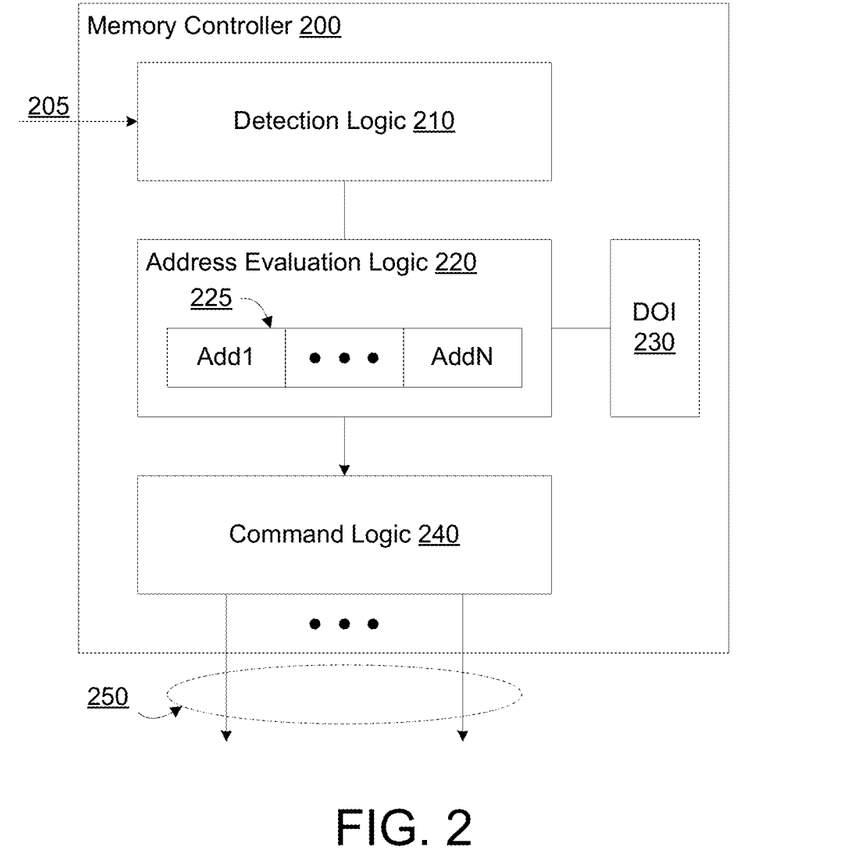
FIG. 2 is a block diagram illustrating element of a memory controller for providing a targeted refresh command according to an embodiment.

FIG. 2 illustrates elements of a memory controller 200 for implementing a targeted refresh of a memory location, according to an embodiment. Memory controller 200 may include some or all of the features of memory controller 120, for example. In an embodiment, memory controller 200 operates to control a memory device (not shown) coupled thereto, where respective addresses for physically adjacent rows of the memory device are offset from one another, and where information describing the address offset is unavailable to memory controller 200. Such a memory device may be unable to determine, for example, that a particular row is to be the target of a target refresh, in the absence of memory controller 200 specifically addressing such a row in association with a command for implementing such a target refresh.

In an embodiment, memory controller 200 includes detection logic 210 to receive an indication 205 that repeated access to a specific row of a memory device exceeds a threshold—e.g. where the specific row is an aggressor row of a hammer event. Indication 205 may specify or otherwise indicate an address of the specific rows. Memory controller 200 may further include address evaluation logic 220 including circuitry to detect for address map information which specifies an offset between physically adjacent rows of the memory device.

By way of illustration and not limitation, memory controller 200 may be configurable—e.g. by a firmware interface process such as a BIOS, an Extensible Firmware Interface (EFI) process, a Unified Extensible Firmware Interface (UEFI) process and/or the like—to have access to reference information which describes respective address offsets for one or more memory devices controlled by memory controller 200. Regardless of whether or not memory controller 200 is actually configured to have access to any such reference information, for any of a variety of reasons, memory controller 200 may not have access to address offset information for the memory device for which a hammer event is indicated by indication 205.

Where address evaluation logic 220 detects such address map information for the memory device, address evaluation logic 220 may, in response to such detecting, determine a respective address for each of one or more victim rows which are physically adjacent to the specific row indicated by indication 205. For example, the detected address map information may include an offset value which is identified as corresponding to the memory device. Address evaluation logic 220 may add such an offset value to (and/or subtract the offset value from) an address for the specific row to identify the address of one or both victim rows. In an embodiment, memory controller 200 further comprises command logic 240 to receive the victim row address, or addresses, which address evaluation logic 220 has identified based on the detected address map information. In response to indication 205, command logic 240 may send one or more commands—e.g. the illustrative plurality of commands 250—each addressed to a respective victim row which memory controller 200 has identified based on the detected address map information.

Alternatively, address evaluation logic 220 may be unable to locate address map information specifying an offset between physically adjacent rows of the memory device associated with indication 205. Where address evaluation logic 220 detects an absence of such address map information for the memory device, the address evaluation logic 220 may, in response, access default offset information DOI 230 which, for example, describes a default scheme for performing target refreshes in response to a hammer event such as that detected with indication 205. In an embodiment, such a default scheme may target rows which are (merely) potential victim rows for the aggressor row associated with indication 205. Such rows may be considered potential victim rows at least insofar as memory controller 200 is unable to identify as such a specific address or addresses for one or more actual victim rows. Based on the DOI 230 and an address for the specific row associated with indication 205, address evaluation logic 220 may determine a plurality of addresses 225 each for a respective row of the memory device associated with indication 205.

In an embodiment, command logic 240 may receive plurality of addresses 225 from address evaluation logic 220. Where no address map information is detected by address evaluation logic 220, command logic 240 may send, in response to indication 205, a plurality of commands 250 each to the memory device for which row hammering is indicated by indication 205. The plurality of commands 250 may include, for each of the determined plurality of addresses 225, a respective command for implementing at least in part a corresponding targeted refresh of a potential victim row. In an embodiment, plurality of commands 250 includes, for each of the determined plurality of addresses 225, a respective sequence of commands, each sequence for the corresponding targeted refresh of a potential victim row. By way of illustration and not limitation, one such sequence of commands of the plurality of commands 250 may include an activate command for a potential victim row followed by a precharge command for that same potential victim row.

Figure 3:
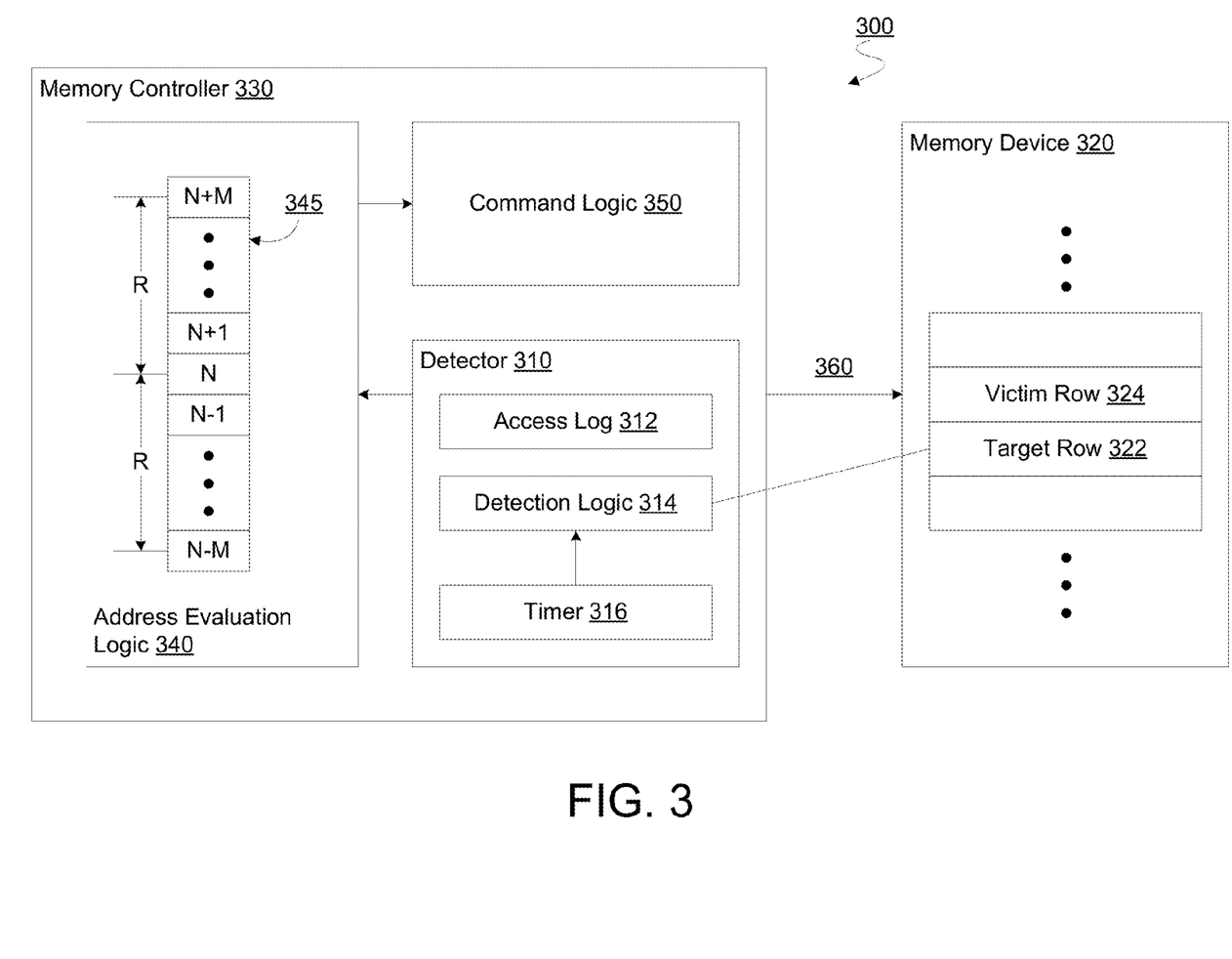
FIG. 3 is a block diagram illustrating element of a system for responding to a row hammer event according to an embodiment.

FIG. 3 is a block diagram of an embodiment of a system 300 for generating commands for implementing targeted refreshes according to an embodiment. System 300 represents an illustrative implementation of functionality provided, for example, by system 100.

System 300 represents an example of a system that includes a memory subsystem with memory controller 330 and memory device 320 coupled thereto. In one embodiment, memory controller 330 includes (or alternatively, couples to) a detector 310 which, for example, has some or all of the features of detector 130. Memory controller 330 may issue commands to implement targeted refreshes in response to detection of a row hammer condition by detector 310.

Memory device 320 may include multiple rows of memory. Among the rows is target row 322, which is a row that is the target of repeated access within a time period. Victim row 324 is a row that is at risk of data corruption due to the hammering of target row 322. There may be more than one victim row associated with a hammered row (e.g., each row physically adjacent to the hammered row).

In one embodiment, detector 310 includes access log 312. Access log 312 may be implemented, for example, as a list or array or table or other logical structure that stores entries having multiple fields of information. Each entry may include an address or identifier for a specific row of memory and an access count for the entry. The count of each row may be incremented as the row is accessed again, where one such count may be compared to a threshold to determine if the corresponding row has been accessed the threshold number of times.

By way of illustration and not limitation, detection logic 314 of detector 310 may include logic to enable detector 310 to determine that an access command is directed to a row of memory. While detection logic 314 is shown specifically with a line to target row 322, detection logic 314 may monitor accesses to any row. In one embodiment, detection logic 314 includes a mechanism to determine an address of an Activate command issued by memory controller 330. Thus, every time memory controller 330 sends a command for memory device 320 to activate a row of memory, detector 310 may identify the address associated with the command, and keep track of access for the address in access log 312.

Detector 310 may receive timer information 316, through which detector 310 may identify the start of a timeframe, as well as the end of a timeframe. Monitoring by detection logic 314 may take place between the start and end of a given timeframe. In one embodiment, a timeframe goes from one scheduled refresh to the next. Based on timer 316 and access log 312, detector 310 may determine when access to a row exceeds a threshold, and indicate the row address information to address evaluation logic 340 of memory controller 330. In an embodiment, address evaluation logic 340 includes some or all of the features of address evaluation logic 220. Detector 310 may clear the count of an entry in access log 312 when the entry reaches the threshold and is identified to address evaluation logic 340. It will be understood that detection may be performed on a rank and/or bank granularity.

In response to detector 310 indicating a row hammer event for target row 322, address evaluation logic 340 may detect for any address map information which specifies an offset between physically adjacent rows of memory device 320. Where such address map information for memory device 320 is detected, address evaluation logic 340 may identify victim row 324 as such—e.g. including address evaluation logic 340 identifying an address of victim row 324 based on the address of target row 322 and an offset value of the detected address map information for memory device 320. Address evaluation logic 340 may provide the address of the identified victim row 324 to command logic 350 of memory controller 330. In an embodiment, command logic 350 includes circuit logic to send, based on the address of the identified victim row 324, one or more commands for implementing a targeted refresh of victim row 324.

Where no such address map information is detected for memory device 320, address evaluation logic 340 may access default offset information which, for example, has some or all of the features of DOI 230. In an embodiment, such default offset information may describe a neighborhood 345 of addresses which includes reference address N. By way of illustration and not limitation, neighborhood 345 may have a range R which is specified or otherwise indicated by the default offset information. The value R may, for example, be equal to 2X, where X is a positive integer. In an embodiment, address evaluation logic 340 determines a plurality of addresses based on such default offset information. For example, address evaluation logic 340 may apply an address for target row 322 as the reference address N—e.g. for neighborhood 345 to include a block of consecutive addresses which include or adjoin the address for target row 322.

Based on the address of target row 322 and the default offset information, address evaluation logic 340 may provide to command logic 350 of memory controller 330 a plurality of addresses. In response to detector 310 detecting the hammer event for target row 322, command logic 350 may send commands 360 to memory device 320 each for implementing at least in part a respective targeted refresh of a potential victim row. In an embodiment, commands 360 includes, for each of the plurality of addresses provided by address evaluation logic 340, a respective command for a corresponding targeted refresh. A large range value R may increase the likelihood that commands 360 include one or more commands which refresh victim row 324.

The plurality of addresses may, for example, include a block of consecutive addresses which are each less than (or alternatively, each greater than) the address of target row 322. Such a block of consecutive addresses may include an address which is also consecutive with the address of target row 322. In an embodiment, the plurality of addresses includes both a block of consecutive addresses which are each less than the address of target row 322, and another block of consecutive addresses which are each greater than the address of target row 322. For example, the plurality of addresses may include each address of neighborhood 345 other than the address for target row 322. The plurality of addresses may further include the address for target row 322, although certain embodiments are not limited in this regard.

Alternatively, the plurality of addresses may include only a subset of address of neighborhood 345. For example, the default offset information may specify an offset value, wherein, for each address of the plurality of addresses, a difference between the each address and a respective closest address of the plurality of addresses is equal to the offset value. In an embodiment, such an offset value is equal to 2X, where X is a positive integer.

For example, the plurality of addresses may include every second consecutive address, or fourth consecutive address, or eighth consecutive address, etc. in a neighborhood of addresses for the address of target row 322.

Figure 4:
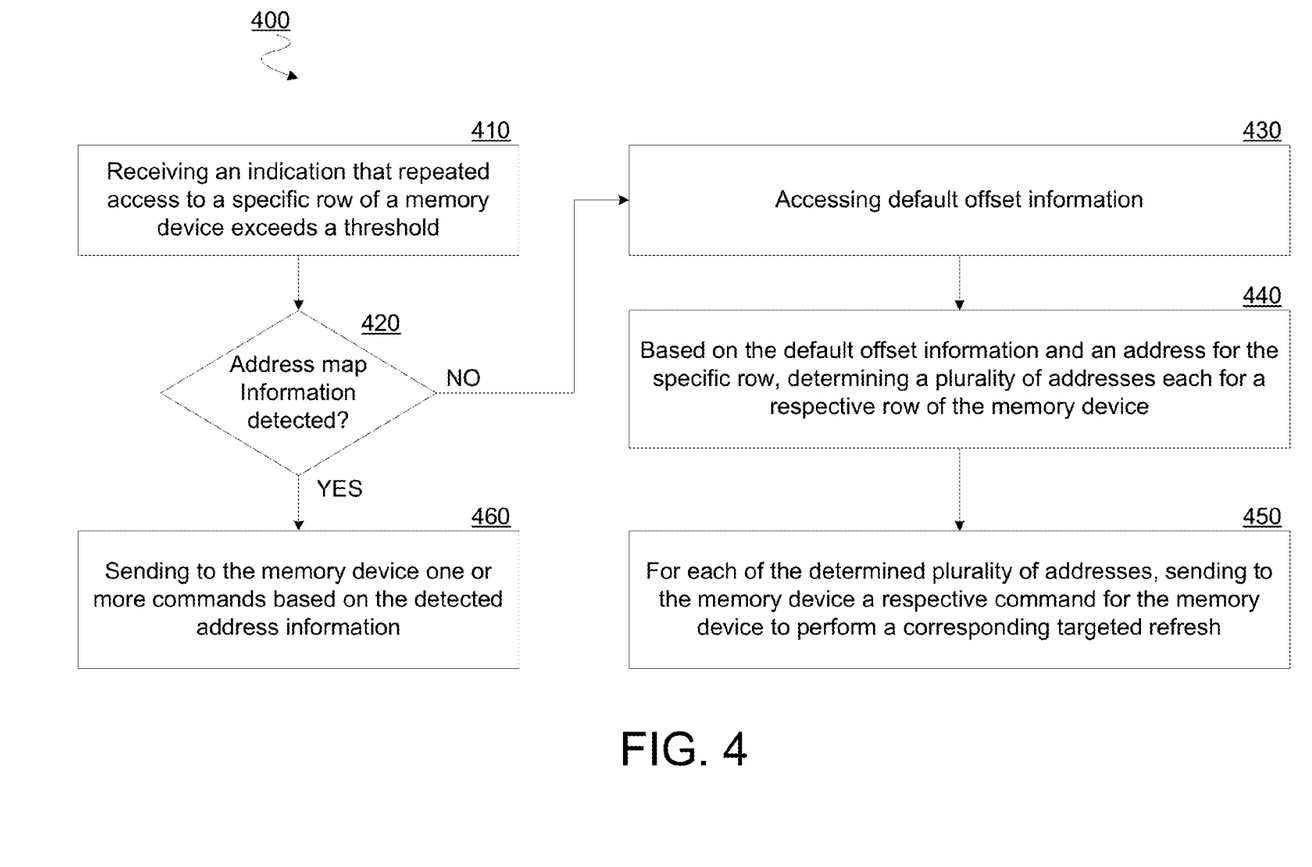
FIG. 4 is a flow diagram illustrating elements of a method for controlling a memory device according to an embodiment.

FIG. 4 illustrates elements of a method 400 for providing a targeted refresh of a memory location according to an embodiment. Method 400 may be performed by a memory controller operating in a system having some or all of the features of system 100, for example. In an embodiment, method 400 is performed by a memory controller which provides functionality of memory controller 200.

Method 400 may include, at 410, receiving an indication that repeated access to a specific row of a memory device exceeds a threshold. The indication may directly or indirectly reference an address for the specific row. Method 400 may further include, at 420, detecting for address map information specifying an offset between physically adjacent rows of the memory device. If operation 420 detects address map information for the memory device, method 400 may include, at 460, sending the memory device one or more commands based on the detected address information. However, if operation 420 fails to detect address map information for the memory device, method 400 may include, at 430, accessing default offset information in response to the failure to detect the address map information. Such default offset information may describe or otherwise indicate a default scheme for performing target refreshes.

Based on the default offset information accessed at 430 and an address for the specific row, method 400 may, at 440, determine a plurality of addresses each for a respective row of the memory device. In response to receiving the indication at 410, method 400 may further include, at 450, for each of the determined plurality of addresses, sending to the memory device a respective command for a corresponding targeted refresh. In an embodiment, the default offset information specifies an address range, wherein, for each address of the plurality of addresses, a respective difference between the each address and the address of the specific row is less than or equal to the address range. Such an address range may, for example be equal to 2X, for some positive integer X. In an embodiment, the memory controller sends to the memory device, for each of the determined plurality of addresses, a respective sequence of commands for the corresponding targeted refresh. For example, one such sequence of commands may include an activate command which is addressed to a potential victim row followed by a precharge command which is addressed to that same potential victim row.

Figure 5:
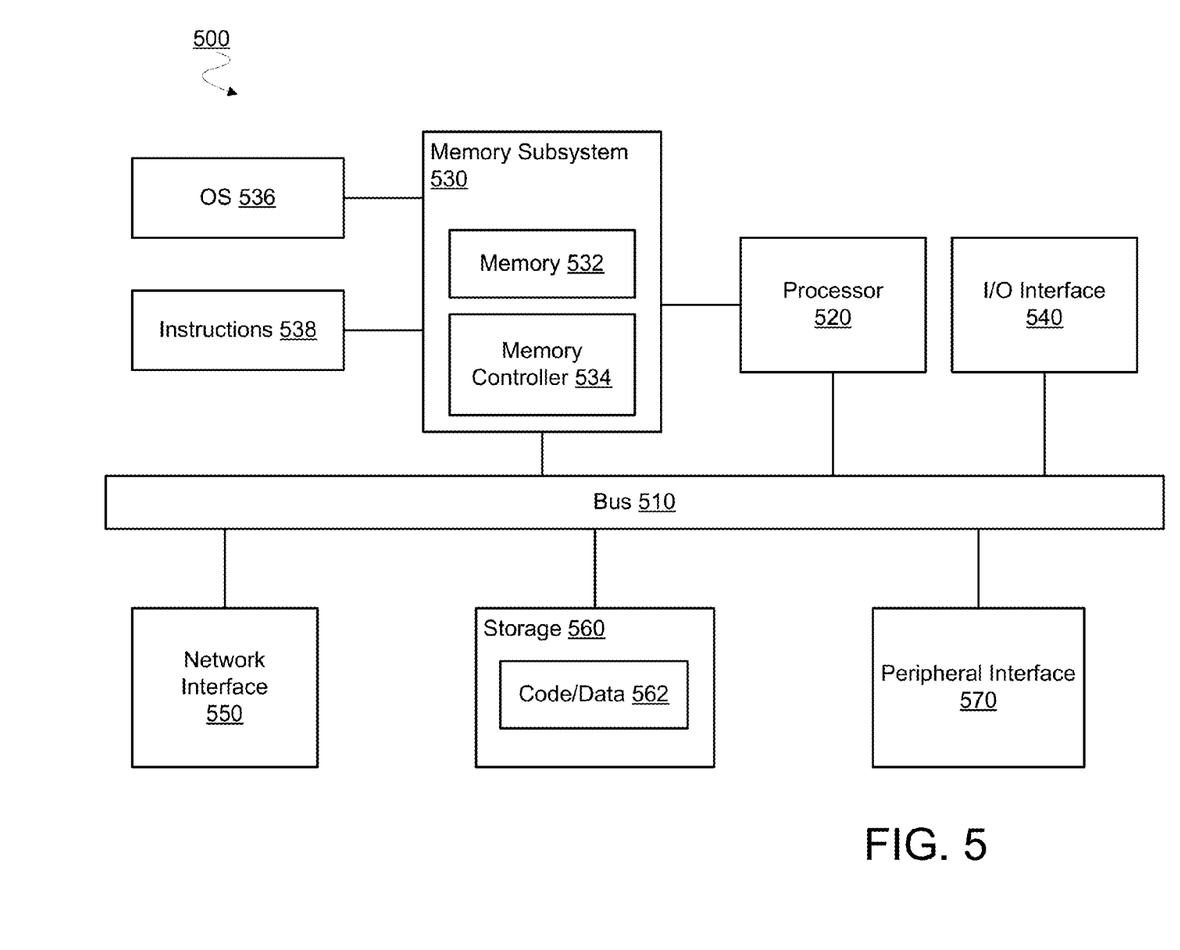
FIG. 5 is a block diagram illustrating elements of a computing system for performing targeted memory refresh according to an embodiment.

FIG. 5 is a block diagram of an embodiment of a computing system in which row hammer protection may be implemented. System 500 represents a computing device in accordance with any embodiment described herein, and may be a laptop computer, a desktop computer, a server, a gaming or entertainment control system, a scanner, copier, printer, or other electronic device. System 500 may include processor 520, which provides processing, operation management, and execution of instructions for system 500. Processor 520 may include any type of microprocessor, central processing unit (CPU), processing core, or other processing hardware to provide processing for system 500. Processor 520 controls the overall operation of system 500, and may be or include, one or more programmable general-purpose or special-purpose microprocessors, digital signal processors (DSPs), programmable controllers, application specific integrated circuits (ASICs), programmable logic devices (PLDs), or the like, or a combination of such devices.

Memory subsystem 530 represents the main memory of system 500, and provides temporary storage for code to be executed by processor 520, or data values to be used in executing a routine. Memory subsystem 530 may include one or more memory devices such as read-only memory (ROM), flash memory, one or more varieties of random access memory (RAM), or other memory devices, or a combination of such devices. Memory subsystem 530 stores and hosts, among other things, operating system (OS) 536 to provide a software platform for execution of instructions in system 500. Additionally, other instructions 538 are stored and executed from memory subsystem 530 to provide the logic and the processing of system 500. OS 536 and instructions 538 are executed by processor 520.

Memory subsystem 530 may include memory device 532 where it stores data, instructions, programs, or other items. In one embodiment, memory subsystem includes memory controller 534, which is a memory controller in accordance with any embodiment described herein, and which provides row hammer protection mechanisms. In one embodiment, memory controller 534 provides commands to memory device 532 each based on a detected row hammer condition. The commands may be for memory device 532 to perform targeted refreshes for respective potential victim rows.

Processor 520 and memory subsystem 530 are coupled to bus/bus system 510. Bus 510 is an abstraction that represents any one or more separate physical buses, communication lines/interfaces, and/or point-to-point connections, connected by appropriate bridges, adapters, and/or controllers. Therefore, bus 510 may include, for example, one or more of a system bus, a Peripheral Component Interconnect (PCI) bus, a HyperTransport or industry standard architecture (ISA) bus, a small computer system interface (SCSI) bus, a universal serial bus (USB), or an Institute of Electrical and Electronics Engineers (IEEE) standard 1394 bus (commonly referred to as "Firewire"). The buses of bus 510 may also correspond to interfaces in network interface 550.

System 500 may also include one or more input/output (I/O) interface(s) 540, network interface 550, one or more internal mass storage device(s) 560, and peripheral interface 570 coupled to bus 510. I/O interface 540 may include one or more interface components through which a user interacts with system 500 (e.g., video, audio, and/or alphanumeric interfacing). Network interface 550 provides system 500 the ability to communicate with remote devices (e.g., servers, other computing devices) over one or more networks. Network interface 550 may include an Ethernet adapter, wireless interconnection components, USB (universal serial bus), or other wired or wireless standards-based or proprietary interfaces.

Storage 560 may be or include any conventional medium for storing large amounts of data in a nonvolatile manner, such as one or more magnetic, solid state, or optical based disks, or a combination. Storage 560 holds code or instructions and data 562 in a persistent state (i.e., the value is retained despite interruption of power to system 500). Storage 560 may be generically considered to be a "memory," although memory 530 is the executing or operating memory to provide instructions to processor 520. Whereas storage 560 is nonvolatile, memory 530 may include volatile memory (i.e., the value or state of the data is indeterminate if power is interrupted to system 500).

Peripheral interface 570 may include any hardware interface not specifically mentioned above. Peripherals refer generally to devices that connect dependently to system 500. A dependent connection is one where system 500 provides the software and/or hardware platform on which operation executes, and with which a user interacts.

Figure 6:
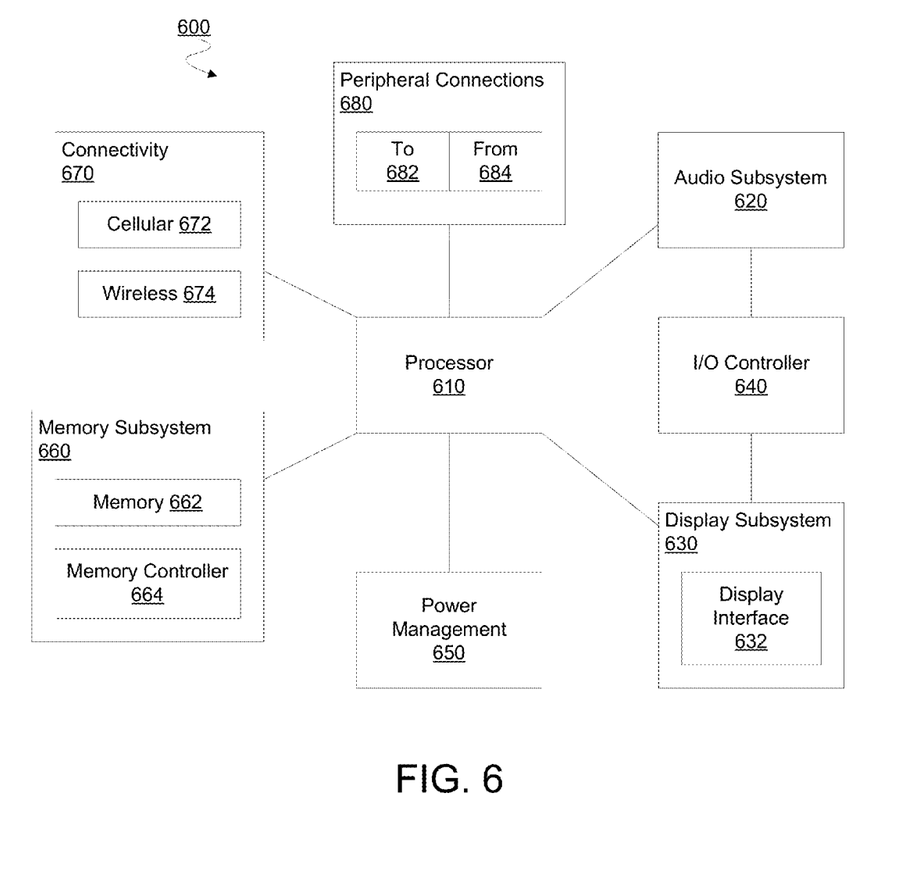
FIG. 6 is a block diagram illustrating elements of a mobile device for performing targeted memory refresh according to an embodiment.

FIG. 6 is a block diagram of an embodiment of a mobile device in which row hammer protections may be implemented. Device 600 represents a mobile computing device, such as a computing tablet, a mobile phone or smartphone, a wireless-enabled e-reader, or other mobile device. It will be understood that certain of the components are shown generally, and not all components of such a device are shown in device 600.

Device 600 may include processor 610, which performs the primary processing operations of device 600. Processor 610 may include one or more physical devices, such as microprocessors, application processors, microcontrollers, programmable logic devices, or other processing means. In one embodiment, processor 610 includes optical interface components in addition to a processor die. Thus, the processor die and photonic components are in the same package. Such a processor package may interface optically with an optical connector in accordance with any embodiment described herein.

The processing operations performed by processor 610 include the execution of an operating platform or operating system on which applications and/or device functions are executed. The processing operations include operations related to I/O (input/output) with a human user or with other devices, operations related to power management, and/or operations related to connecting device 600 to another device. The processing operations may also include operations related to audio I/O and/or display I/O.

In one embodiment, device 600 includes audio subsystem 620, which represents hardware (e.g., audio hardware and audio circuits) and software (e.g., drivers, codecs) components associated with providing audio functions to the computing device. Audio functions may include speaker and/or headphone output, as well as microphone input. Devices for such functions may be integrated into device 600, or connected to device 600. In one embodiment, a user interacts with device 600 by providing audio commands that are received and processed by processor 610.

Display subsystem 630 represents hardware (e.g., display devices) and software (e.g., drivers) components that provide a visual and/or tactile display for a user to interact with the computing device. Display subsystem 630 may include display interface 632, which may include the particular screen or hardware device used to provide a display to a user. In one embodiment, display interface 632 includes logic separate from processor 610 to perform at least some processing related to the display. In one embodiment, display subsystem 630 includes a touchscreen device that provides both output and input to a user.

I/O controller 640 represents hardware devices and software components related to interaction with a user. I/O controller 640 may operate to manage hardware that is part of audio subsystem 620 and/or display subsystem 630. Additionally, I/O controller 640 illustrates a connection point for additional devices that connect to device 600 through which a user might interact with the system. For example, devices that may be attached to device 600 might include microphone devices, speaker or stereo systems, video systems or other display device, keyboard or keypad devices, or other I/O devices for use with specific applications such as card readers or other devices.

As mentioned above, I/O controller 640 may interact with audio subsystem 620 and/or display subsystem 630. For example, input through a microphone or other audio device may provide input or commands for one or more applications or functions of device 600. Additionally, audio output may be provided instead of or in addition to display output. In another example, if display subsystem includes a touchscreen, the display device also acts as an input device, which may be at least partially managed by I/O controller 640. There may also be additional buttons or switches on device 600 to provide I/O functions managed by I/O controller 640.

In one embodiment, I/O controller 640 manages devices such as accelerometers, cameras, light sensors or other environmental sensors, gyroscopes, global positioning system (GPS), or other hardware that may be included in device 600. The input may be part of direct user interaction, as well as providing environmental input to the system to influence its operations (such as filtering for noise, adjusting displays for brightness detection, applying a flash for a camera, or other features).

In one embodiment, device 600 includes power management 650 that manages battery power usage, charging of the battery, and features related to power saving operation. Memory subsystem 660 may include memory device(s) 662 for storing information in device 600. Memory subsystem 660 may include nonvolatile (state does not change if power to the memory device is interrupted) and/or volatile (state is indeterminate if power to the memory device is interrupted) memory devices. Memory 660 may store application data, user data, music, photos, documents, or other data, as well as system data (whether long-term or temporary) related to the execution of the applications and functions of system 600.

In one embodiment, memory subsystem 660 includes memory controller 664 (which could also be considered part of the control of system 600, and could potentially be considered part of processor 610). Memory controller 664 monitors for a row hammer condition. For example, memory controller 664 may monitor the requests to certain memory addresses, and log how many times a specific address is the subject of a request. In an embodiment, memory controller 664 issues commands for targeted refreshes of potential victim rows of memory 662—e.g. in the absence of memory controller 664 determining an address offset for physically adjacent rows of memory 662.

Connectivity 670 may include hardware devices (e.g., wireless and/or wired connectors and communication hardware) and software components (e.g., drivers, protocol stacks) to enable device 600 to communicate with external devices. The device could be separate devices, such as other computing devices, wireless access points or base stations, as well as peripherals such as headsets, printers, or other devices.

Connectivity 670 may include multiple different types of connectivity. To generalize, device 600 is illustrated with cellular connectivity 672 and wireless connectivity 674. Cellular connectivity 672 refers generally to cellular network connectivity provided by wireless carriers, such as provided via GSM (global system for mobile communications) or variations or derivatives, CDMA (code division multiple access) or variations or derivatives, TDM (time division multiplexing) or variations or derivatives, LTE (long term evolution—also referred to as "4G"), or other cellular service standards. Wireless connectivity 674 refers to wireless connectivity that is not cellular, and may include personal area networks (such as Bluetooth), local area networks (such as WiFi), and/or wide area networks (such as WiMax), or other wireless communication. Wireless communication refers to transfer of data through the use of modulated electromagnetic radiation through a non-solid medium. Wired communication occurs through a solid communication medium.

Peripheral connections 680 include hardware interfaces and connectors, as well as software components (e.g., drivers, protocol stacks) to make peripheral connections. It will be understood that device 600 could both be a peripheral device ("to" 682) to other computing devices, as well as have peripheral devices ("from" 684) connected to it. Device 600 commonly has a "docking" connector to connect to other computing devices for purposes such as managing (e.g., downloading and/or uploading, changing, synchronizing) content on device 600. Additionally, a docking connector may allow device 600 to connect to certain peripherals that allow device 600 to control content output, for example, to audiovisual or other systems.

In addition to a proprietary docking connector or other proprietary connection hardware, device 600 may make peripheral connections 680 via common or standards-based connectors. Common types may include a Universal Serial Bus (USB) connector (which may include any of a number of different hardware interfaces), DisplayPort including MiniDisplayPort (MDP), High Definition Multimedia Interface (HDMI), Firewire, or other type.

In one aspect, a memory controller comprises detection logic to receive an indication that repeated access to a specific row of a memory device exceeds a threshold. The memory controller further comprises address evaluation logic to detect for address map information specifying an offset between physically adjacent rows of the memory device, to access default offset information in response to a failure of the address evaluation logic to detect the address map information and, based on the default offset information and an address for the specific row, to determine a plurality of addresses each for a respective row of the memory device. The memory controller further comprises command logic to receive the determined plurality of addresses, wherein, in response to the indication, the command logic to send to the memory device, for each of the determined plurality of addresses, a respective command for a corresponding targeted refresh.

In an embodiment, the default offset information specifies an address range, wherein, for each address of the plurality of addresses, a respective difference between the each address and the address of the specific row is less than or equal to the address range. In an embodiment, the address range is equal to $2^X$, where X is a positive integer. In an embodiment, for each address of the plurality of addresses, a respective difference between the each address and the address of the specific row is less than the address range. In an embodiment, the plurality of addresses includes a block of consecutive addresses which are each less than the address of the specific row or each greater than the address of the specific row, wherein the block of consecutive addresses includes a first address consecutive with the address of the specific row.

In an embodiment, the plurality of addresses includes a first block of consecutive addresses which are each less than the address of the specific row, and a second block of consecutive addresses which are each greater than the address of the specific row. In an embodiment, the default offset information specifies an offset value equal to $2^X$, where X is a positive integer, wherein, for each address of the plurality of addresses, a difference between the each address and a respective closest address of the plurality of addresses is equal to the offset value. In an embodiment, the command logic is to send to the memory device, for each of the determined plurality of addresses, a respective sequence of commands for the corresponding targeted refresh. In an embodiment, one of the respective sequence of commands for each of the determined plurality of addresses includes an activate command followed by a precharge command.

In another aspect, a memory subsystem comprises a memory device and a memory controller to coupled to the memory device. The memory controller includes detection logic to receive an indication that repeated access to a specific row of the memory device exceeds a threshold. The memory controller further includes address evaluation logic to detect for address map information specifying an offset between physically adjacent rows of the memory device, to access default offset information in response to a failure of the address evaluation logic to detect the address map information and, based on the default offset information and an address for the specific row, to determine a plurality of addresses each for a respective row of the memory device. The memory controller further includes command logic to receive the determined plurality of addresses, wherein, in response to the indication, the command logic to send to the memory device, for each of the determined plurality of addresses, a respective command for a corresponding targeted refresh.

In an embodiment, wherein the default offset information specifies an address range, wherein, for each address of the plurality of addresses, a respective difference between the each address and the address of the specific row is less than or equal to the address range. In an embodiment, the address range is equal to $2^X$, where X is a positive integer. In an embodiment, for each address of the plurality of addresses, a respective difference between the each address and the address of the specific row is less than the address range. In an embodiment, the plurality of addresses includes a block of consecutive addresses which are each less than the address of the specific row or each greater than the address of the specific row, wherein the block of consecutive addresses includes a first address consecutive with the address of the specific row.

In an embodiment, the plurality of addresses includes a first block of consecutive addresses which are each less than the address of the specific row, and a second block of consecutive addresses which are each greater than the address of the specific row. In an embodiment, the default offset information specifies an offset value equal to $2^X$, where X is a positive integer, wherein, for each address of the plurality of addresses, a difference between the each address and a respective closest address of the plurality of addresses is equal to the offset value. In an embodiment, the command logic is to send to the memory device, for each of the determined plurality of addresses, a respective sequence of commands for the corresponding targeted refresh. In an embodiment, one of the respective sequence of commands for each of the determined plurality of addresses includes an activate command followed by a precharge command.

In another aspect, a method at a memory controller comprises receiving an indication that repeated access to a specific row of a memory device exceeds a threshold, and detecting for address map information specifying an offset between physically adjacent rows of the memory device. The method further comprises, in response to a failure to detect the address map information, accessing default offset information and, based on the default offset information and an address for the specific row, determining a plurality of addresses each for a respective row of the memory device. The method further comprises, in response to receiving the indication, for each of the determined plurality of addresses, sending to the memory device a respective command for a corresponding targeted refresh.

In an embodiment, the default offset information specifies an address range, wherein, for each address of the plurality of addresses, a respective difference between the each address and the address of the specific row is less than or equal to the address range. In an embodiment, the address range is equal to $2^X$, where X is a positive integer. In an embodiment, for each address of the plurality of addresses, a respective difference between the each address and the address of the specific row is less than the address range.

In an embodiment, the plurality of addresses includes a block of consecutive addresses which are each less than the address of the specific row or each greater than the address of the specific row, wherein the block of consecutive addresses includes a first address consecutive with the address of the specific row. In an embodiment, the plurality of addresses includes a first block of consecutive addresses which are each less than the address of the specific row, and a second block of consecutive addresses which are each greater than the address of the specific row. In an embodiment, the memory controller sends to the memory device, for each of the determined plurality of addresses, a respective sequence of commands for the corresponding targeted refresh. In an embodiment, one of the respective sequence of commands for each of the determined plurality of addresses includes an activate command followed by a precharge command.

In another aspect, computer-readable storage medium has stored thereon instructions which, when executed by one or more processing units, cause the one or more processing units to perform a method. The method comprises receiving an indication that repeated access to a specific row of a memory device exceeds a threshold, and detecting for address map information specifying an offset between physically adjacent rows of the memory device. The method further comprises, in response to a failure to detect the address map information, accessing default offset information, and based on the default offset information and an address for the specific row, determining a plurality of addresses each for a respective row of the memory device. The method further comprises, in response to receiving the indication, for each of the determined plurality of addresses, sending to the memory device a respective command for a corresponding targeted refresh.

In an embodiment, the default offset information specifies an address range, wherein, for each address of the plurality of addresses, a respective difference between the each address and the address of the specific row is less than or equal to the address range. In an embodiment, the plurality of addresses includes a block of consecutive addresses which are each less than the address of the specific row or each greater than the address of the specific row, wherein the block of consecutive addresses includes a first address consecutive with the address of the specific row. In an embodiment, the plurality of addresses includes a first block of consecutive addresses which are each less than the address of the specific row, and a second block of consecutive addresses which are each greater than the address of the specific row.

Techniques and architectures for controlling a memory device are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Reference in the specification to "one embodiment" or "an embodiment" means that a particular feature, structure, or characteristic described in connection with the embodiment is included in at least one embodiment of the invention. The appearances of the phrase "in one embodiment" in various places in the specification are not necessarily all referring to the same embodiment.

Some portions of the detailed description herein are presented in terms of algorithms and symbolic representations of operations on data bits within a computer memory. These algorithmic descriptions and representations are the means used by those skilled in the computing arts to most effectively convey the substance of their work to others skilled in the art. An algorithm is here, and generally, conceived to be a self-consistent sequence of steps leading to a desired result. The steps are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion herein, it is appreciated that throughout the description, discussions utilizing terms such as "processing" or "computing" or "calculating" or "determining" or "displaying" or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Certain embodiments also relate to apparatus for performing the operations herein. This apparatus may be specially constructed for the required purposes, or it may comprise a general purpose computer selectively activated or reconfigured by a computer program stored in the computer. Such a computer program may be stored in a computer readable storage medium, such as, but is not limited to, any type of disk including floppy disks, optical disks, CD-ROMs, and magnetic-optical disks, read-only memories (ROMs), random access memories (RAMs) such as dynamic RAM (DRAM), EPROMs, EEPROMs, magnetic or optical cards, or any type of media suitable for storing electronic instructions, and coupled to a computer system bus.

The algorithms and displays presented herein are not inherently related to any particular computer or other apparatus. Various general purpose systems may be used with programs in accordance with the teachings herein, or it may prove convenient to construct more specialized apparatus to perform the required method steps. The required structure for a variety of these systems will appear from the description herein. In addition, certain embodiments are not described with reference to any particular programming language. It will be appreciated that a variety of programming languages may be used to implement the teachings of such embodiments as described herein.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A memory controller comprising:
    detection logic to receive an indication that repeated access to a specific row of a memory device exceeds a threshold;
    address evaluation logic to detect for address map information specifying an offset between physically adjacent rows of the memory device, to access default offset information in response to a failure of the address evaluation logic to detect the address map information and, based on the default offset information and an address for the specific row, to determine a plurality of addresses each for a respective row of the memory device, wherein the default offset information specifies an address range, and wherein, for each address of the plurality of addresses, a respective difference between the each address and the address of the specific row is less than or equal to the address range; and
    command logic to receive the determined plurality of addresses, wherein, in response to the indication, the command logic to send to the memory device, for each of the determined plurality of addresses, a respective command for a corresponding targeted refresh.

2. The memory controller of claim 1, wherein the address range is equal to $2^x$, where X is a positive integer.

3. The memory controller of claim 1, wherein, for each address of the plurality of addresses, a respective difference between the each address and the address of the specific row is less than the address range.

4. The memory controller of claim 1, wherein the plurality of addresses includes:
    a block of consecutive addresses which are each less than the address of the specific row or each greater than the address of the specific row, wherein the block of consecutive addresses includes a first address consecutive with the address of the specific row.

5. The memory controller of claim 1, wherein the plurality of addresses includes:
    a first block of consecutive addresses which are each less than the address of the specific row; and
    a second block of consecutive addresses which are each greater than the address of the specific row.

6. The memory controller of claim 1, wherein the default offset information specifies an offset value equal to $2^x$, where X is a positive integer, and wherein, for each address of the plurality of addresses, a difference between the each address and a respective closest address of the plurality of addresses is equal to the offset value.

7. The memory controller of claim 1, wherein the command logic to send to the memory device, for each of the determined plurality of addresses, a respective sequence of commands for the corresponding targeted refresh.

8. The memory controller of claim 7, wherein one of the respective sequence of commands for each of the determined plurality of addresses includes an activate command followed by a precharge command.

9. A memory subsystem comprising:
    a memory device; and
    a memory controller to coupled to the memory device, the memory controller including:
        detection logic to receive an indication that repeated access to a specific row of the memory device exceeds a threshold;
        address evaluation logic to detect for address map information specifying an offset between physically adjacent rows of the memory device, to access default offset information in response to a failure of the address evaluation logic to detect the address map information and, based on the default offset information and an address for the specific row, to determine a plurality of addresses each for a respective row of the memory device, wherein the default offset information specifies an address range, and wherein, for each address of the plurality of addresses, a respective difference between the each address and the address of the specific row is less than or equal to the address range; and command logic to receive the determined plurality of addresses, wherein, in response to the indication, the command logic to send to the memory device, for each of the determined plurality of addresses, a respective command for a corresponding targeted refresh.

10. The memory subsystem of claim 9, wherein the address range is equal to $2^x$, where X is a positive integer.

11. The memory subsystem of claim 9, wherein, for each address of the plurality of addresses, a respective difference between the each address and the address of the specific row is less than the address range.

12. The memory subsystem of claim 9, wherein the plurality of addresses includes:
a block of consecutive addresses which are each less than the address of the specific row or each greater than the address of the specific row, wherein the block of consecutive addresses includes a first address consecutive with the address of the specific row.

13. The memory subsystem of claim 9, wherein the plurality of addresses includes:
a first block of consecutive addresses which are each less than the address of the specific row; and
a second block of consecutive addresses which are each greater than the address of the specific row.

14. The memory subsystem of claim 9, wherein the default offset information specifies an offset value equal to $2^x$, where X is a positive integer, and wherein, for each address of the plurality of addresses, a difference between the each address and a respective closest address of the plurality of addresses is equal to the offset value.

15. The memory subsystem of claim 9, wherein the command logic to send to the memory device, for each of the determined plurality of addresses, a respective sequence of commands for the corresponding targeted refresh.

16. The memory subsystem of claim 15, wherein one of the respective sequence of commands for each of the determined plurality of addresses includes an activate command followed by a precharge command.

17. A method at a memory controller, the method comprising:
receiving an indication that repeated access to a specific row of a memory device exceeds a threshold;
detecting for address map information specifying an offset between physically adjacent rows of the memory device; and
in response to a failure to detect the address map information:
accessing default offset information;
based on the default offset information and an address for the specific row, determining a plurality of addresses each for a respective row of the memory device, wherein the default offset information specifies an address range, and wherein, for each address of the plurality of addresses, a respective difference between the each address and the address of the specific row is less than or equal to the address range; and
in response to receiving the indication, for each of the determined plurality of addresses:
sending to the memory device a respective command for a corresponding targeted refresh.

18. The method of claim 17, wherein the address range is equal to $2^x$, where X is a positive integer.

19. The method of claim 17, wherein, for each address of the plurality of addresses, a respective difference between the each address and the address of the specific row is less than the address range.

20. The method of claim 17, wherein the plurality of addresses includes:
a block of consecutive addresses which are each less than the address of the specific row or each greater than the address of the specific row, wherein the block of consecutive addresses includes a first address consecutive with the address of the specific row.

21. The method of claim 17, wherein the plurality of addresses includes:
a first block of consecutive addresses which are each less than the address of the specific row; and
a second block of consecutive addresses which are each greater than the address of the specific row.

22. The method of claim 17, wherein the memory controller sends to the memory device, for each of the determined plurality of addresses, a respective sequence of commands for the corresponding targeted refresh.

23. The method of claim 22, wherein one of the respective sequence of commands for each of the determined plurality of addresses includes an activate command followed by a precharge command.

24. A computer-readable storage medium having stored thereon instructions which, when executed by one or more processing units, cause the one or more processing units to perform a method comprising:
receiving an indication that repeated access to a specific row of a memory device exceeds a threshold;
detecting for address map information specifying an offset between physically adjacent rows of the memory device; and
in response to a failure to detect the address map information:
accessing default offset information;
based on the default offset information and an address for the specific row, determining a plurality of addresses each for a respective row of the memory device, wherein the default offset information specifies an address range, and wherein, for each address of the plurality of addresses, a respective difference between the each address and the address of the specific row is less than or equal to the address range; and
in response to receiving the indication, for each of the determined plurality of addresses:
sending to the memory device a respective command for a corresponding targeted refresh.

25. The computer-readable storage medium of claim 24, wherein the plurality of addresses includes:
a block of consecutive addresses which are each less than the address of the specific row or each greater than the address of the specific row, wherein the block of consecutive addresses includes a first address consecutive with the address of the specific row.

26. The computer-readable storage medium of claim 24, wherein the plurality of addresses includes:
a first block of consecutive addresses which are each less than the address of the specific row; and
a second block of consecutive addresses which are each greater than the address of the specific row.

* * * * *